United States Patent
Nam

(10) Patent No.: US 9,599,887 B2
(45) Date of Patent: Mar. 21, 2017

(54) PHOTO MASK INCLUDING PRE-ALIGNMENT KEYS AND PHOTOLITHOGRAPHY APPARATUS PERFORMING A PRE-ALIGNMENT PROCESS FOR THE PHOTO MASK

(71) Applicant: SK hynix Inc., Icheon (KR)

(72) Inventor: Byung Ho Nam, Daegu (KR)

(73) Assignee: SK HYNIX INC., Icheon (KR)

( * ) Notice: Subject to any disclaimer, the term of this patent is extended or adjusted under 35 U.S.C. 154(b) by 49 days.

(21) Appl. No.: 14/850,835

(22) Filed: Sep. 10, 2015

(65) Prior Publication Data

US 2016/0306273 A1 Oct. 20, 2016

(30) Foreign Application Priority Data

Apr. 17, 2015 (KR) .................... 10-2015-0054421

(51) Int. Cl.
*G03F 1/42* (2012.01)
(52) U.S. Cl.
CPC ...................................... *G03F 1/42* (2013.01)
(58) Field of Classification Search
CPC ....................................................... G03F 1/42
See application file for complete search history.

(56) References Cited

U.S. PATENT DOCUMENTS

| | | | | |
|---|---|---|---|---|
| 6,300,018 | B1 * | 10/2001 | Dilley | G03F 1/42 430/22 |
| 6,337,162 | B1 * | 1/2002 | Irie | G03F 7/70258 430/17 |
| 6,710,847 | B1 * | 3/2004 | Irie | G03F 7/70475 235/462.05 |
| 2002/0034694 | A1 * | 3/2002 | Tanaka | G03F 1/32 430/5 |
| 2009/0061330 | A1 * | 3/2009 | Irie | G03F 1/32 430/5 |
| 2013/0219350 | A1 * | 8/2013 | Lee | G03F 1/70 716/54 |

FOREIGN PATENT DOCUMENTS

| | | |
|---|---|---|
| KR | 10-2007-0077690 A | 7/2007 |
| KR | 10-2009-0044534 A | 5/2009 |

* cited by examiner

*Primary Examiner* — Stewart Fraser

(57) ABSTRACT

A photo mask includes a pre-alignment key used in a pre-alignment process performed in a photolithography apparatus. The pre-alignment key includes a pre-alignment pattern including a light transmitting area and a light blocking area surrounding the pre-alignment pattern. The light blocking area includes a plurality of light blocking patterns and a diffraction grating pattern separating the plurality of light blocking patterns from each other.

21 Claims, 14 Drawing Sheets

PHOTO MASK INCLUDING PRE-ALIGNMENT KEYS AND PHOTOLITHOGRAPHY APPARATUS PERFORMING A PRE-ALIGNMENT PROCESS FOR THE PHOTO MASK

CROSS-REFERENCE TO RELATED APPLICATIONS

The present application claims priority under 35 U.S.C 119(a) to Korean Patent Application No. 10-2015-0054421, filed on Apr. 17, 2015, in the Korean Intellectual Property Office, which is incorporated herein by reference in its entirety as set forth in full.

BACKGROUND

1. Technical Field

Various embodiments of the present disclosure relate to photo masks used in a lithography process and, more particularly, to photo masks including pre-alignment keys and photolithography apparatuses performing a pre-alignment process for the photo masks.

2. Related Art

In general, a photo mask is located between a wafer and a light source in a photolithography apparatus to perform a photolithography process for transferring circuit patterns of the photo mask onto the wafer. In order to perform the photolithography process, the photo mask may be loaded on a stage in the photolithography apparatus. In such a case, it may be very important to accurately load the photo mask on a predetermined position of the stage. This is because alignment accuracy in the photolithography process depends on the position of the photo mask. The position of the photo mask loaded on the stage may be controlled by a pre-alignment process.

SUMMARY

Various embodiments are directed to photo masks including pre-alignment keys and photolithography apparatuses performing a pre-alignment process for the photo masks.

According to an embodiment, a photo mask includes a pre-alignment key used in a pre-alignment process performed in a photolithography apparatus. The pre-alignment key includes a pre-alignment pattern comprised of a light transmitting area and a light blocking area surrounding the pre-alignment pattern. The light blocking area includes a plurality of light blocking patterns and a diffraction grating pattern separating the plurality of light blocking patterns from each other.

According to other embodiment, a photo mask includes a pre-alignment key used in a pre-alignment process performed in a photolithography apparatus. The pre-alignment key includes an identification pattern area having a barcode-shaped identification patterns and a first light blocking area disposed at a first side of the identification pattern area. The first light blocking area includes a plurality of first light blocking patterns and a first diffraction grating pattern separating the plurality of first light blocking patterns from each other.

According to another embodiment, a photolithography apparatus includes an alignment light source generating a light irradiated onto the photo mask during the pre-alignment process, and an optical receiver detecting a light passing through the photo mask to obtain a coordinate of the photo mask. The photo mask includes a pre-alignment key and is loaded between the alignment light source and the optical receiver. The optical receiver obtains the coordinate of the photo mask by detecting a light passing through the pre-alignment key. The apparatus adjusts the location of the photo mask using the coordinate of the photo mask. The pre-alignment key comprises, a pre-alignment pattern including a light transmitting area, and a light blocking area surrounding the pre-alignment pattern. The light blocking area includes a plurality of light blocking patterns and a diffraction grating pattern separating the plurality of light blocking patterns from each other, and a maximum pitch of the plurality of light blocking patterns is equal to or smaller than 1.5 times a wavelength of the light generated from the alignment light source.

According to another embodiment, a photolithography apparatus includes an alignment light source generating a light irradiated onto the photo mask during the pre-alignment process, and an optical receiver detecting a light passing through the photo mask to obtain a coordinate of the photo mask. The photo mask includes a pre-alignment key and is loaded between the alignment light source and the optical receiver. The optical receiver obtains the coordinate of the photo mask by detecting a light passing through the pre-alignment key. The apparatus adjusts the location of the photo mask using the coordinate of the photo mask. The pre-alignment key includes a first pre-alignment pattern including a light transmitting area, a second pre-alignment pattern disposed in the first pre-alignment pattern, and a light blocking area surrounding the first pre-alignment pattern. The light blocking area includes a plurality of light blocking patterns and a diffraction grating pattern separating the plurality of first light blocking patterns from each other. A maximum pitch of the plurality of light blocking patterns is equal to or smaller than 1.5 times a wavelength of the light generated from the alignment light source.

According to another embodiment, a photolithography apparatus includes an alignment light source generating a light irradiated onto the photo mask during the pre-alignment process, and an optical receiver detecting a light passing through the photo mask to obtain a coordinate of the photo mask. The photo mask includes a pre-alignment key and is loaded between the alignment light source and the optical receiver. The optical receiver obtains the coordinate of the photo mask by detecting a light passing through the pre-alignment key. The apparatus adjusts the location of the photo mask using the coordinate of the photo mask. The pre-alignment key includes an identification pattern area including barcode-shaped identification patterns, and one or more light blocking areas disposed at any one or both of two sides of the identification pattern area. Each of the light blocking area includes a plurality of light blocking patterns and a diffraction grating pattern separating the plurality of light blocking patterns from each other. A maximum pitch of the plurality of light blocking patterns is equal to or smaller than 1.5 times a wavelength of the light generated from the alignment light source.

BRIEF DESCRIPTION OF THE DRAWINGS

Various embodiments of the present disclosure will become more apparent in view of the attached drawings and accompanying detailed description, in which.

DETAILED DESCRIPTION OF THE EMBODIMENTS

It will be understood that although the terms such as "first," "second," "third," etc. may be used herein to describe various elements, these elements should not be limited by these terms. These terms are only used to distinguish one element from another element. Thus, a first element in some embodiments could be termed a second element in other embodiments without departing from the teachings of the present disclosure.

It will also be understood that when an element is referred to as being located "under," "beneath," "below," "lower," "on," "over," "above," "upper," "side," or "aside" another element, it can be directly contact the other element, or at least one intervening element may also be present therebetween. Accordingly, the terms such as "under," "beneath," "below," "lower," "on," "over," "above," "upper," "side," or "aside" and the like which are used herein are for the purpose of describing particular embodiments only and are not intended to limit the scope of the present disclosure. Other words used to describe the relationship between elements or layers should be interpreted in a like fashion (e.g., "between" versus "directly between" or "adjacent" versus "directly adjacent").

It will be further understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Figure 1:
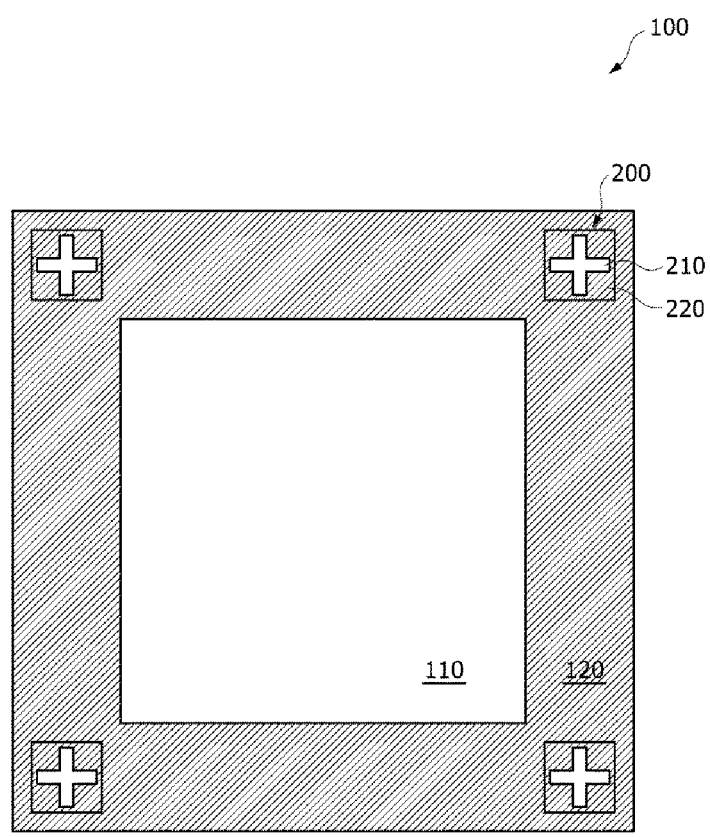
FIG. 1 is a plan view illustrating a photo mask according to a first embodiment.

FIG. 1 is a plan view illustrating a photo mask 100 according to a first embodiment. Referring to FIG. 1, the photo mask 100 may include a pattern region 110 and a frame region 120. The frame region 120 may be disposed to surround the pattern region 110. The pattern region 110 may include transfer patterns (not shown) which are to be transferred onto a wafer in a lithography process. The transfer patterns may be dark tone patterns or bright tone patterns.

The frame region 120 may include a light blocking pattern. The frame region 120 may correspond to a marginal region which is provided to prevent process errors from being generated by an unnecessary exposure in a border region between adjacent shot areas (or adjacent chip areas) defined by an exposure step.

At least one pre-alignment key 200 may be disposed in the frame region 120. FIG. 1 illustrates four pre-alignment keys 200 that are respectively disposed in four corners of the frame region 120, but embodiments are not limited thereto. In other embodiments, the number of pre-alignment keys and positions of the pre-alignment keys may be different from those of the embodiment illustrated in FIG. 1.

Each of the pre-alignment keys 200 may include a pre-alignment pattern 210 and a light blocking area 220 surrounding the pre-alignment pattern 210. A detailed configuration of each pre-alignment key 200 will be described hereinafter with reference to FIGS. 2 and 3.

Figure 2:
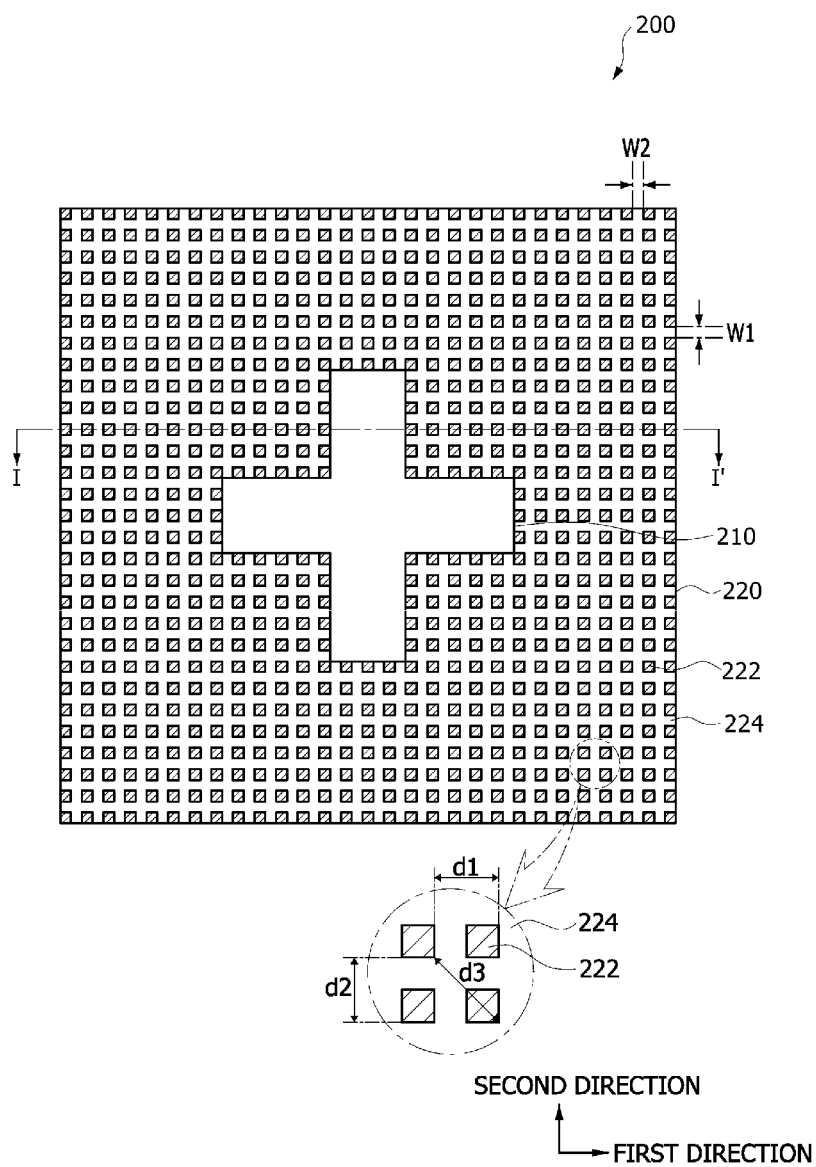
FIG. 2 is an enlarged view of a pre-alignment key included in the photo mask of FIG. 1.
Figure 3:
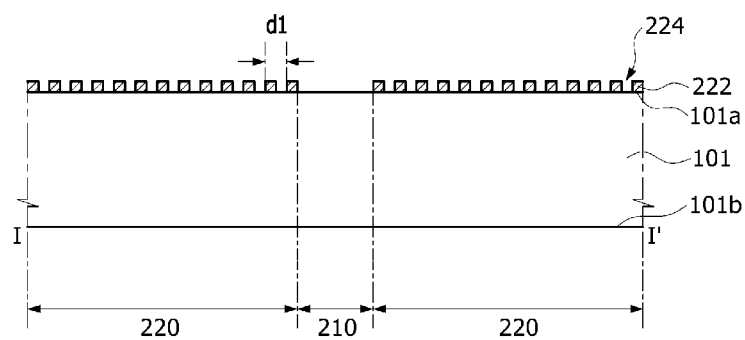
FIG. 3 is a cross-sectional view taken along a line I-I' of FIG. 2.

FIG. 2 is an enlarged view of the pre-alignment key 200 included in the photo mask 100 of FIG. 1, and FIG. 3 is a cross-sectional view taken along a line I-I' of FIG. 2. Referring to FIGS. 2 and 3, the pre-alignment key 200 may include the pre-alignment pattern 210 and the light blocking area 220 surrounding the pre-alignment pattern 210, as described above with reference to FIG. 1.

The pre-alignment pattern 210 may correspond to a light transmitting area in which a top surface 101a of a light transmission substrate 101 is exposed. If a light is irradiated onto a bottom surface 101b of the light transmission substrate 101, the light may pass through the light transmission substrate 101 and the pre-alignment pattern 210. In the event that optical loss in the light transmission substrate 101 is negligible, most of the light irradiated toward the pre-alignment pattern 210 may pass through the pre-alignment pattern 210.

FIG. 2 illustrates the pre-alignment pattern 210 having a cross shape when viewed in a plan view, but embodiments are not limited thereto. That is, the pre-alignment pattern 210 may have a planar shape different from that of the embodiment illustrated in FIG. 2 according to embodiments.

The light blocking area 220 may include a plurality of light blocking patterns 222 and a diffraction grating pattern 224 separating the plurality of light blocking patterns 222 from each other. The light blocking patterns 222 may be two-dimensionally disposed on the top surface 101a of the light transmission substrate 101, and each of the light blocking patterns 222 may have an island shape. Thus, the diffraction grating pattern 224 disposed between the light blocking patterns 222 may have a mesh shape when viewed in a plan view. Each of the light blocking patterns 222 may have a tetragonal shape when viewed in a plan view.

The diffraction grating pattern 224 may correspond to a light transmitting area in which the top surface 101a of the light transmission substrate 101 is exposed. A first width W1 of the diffraction grating pattern 224 in a second direction (i.e., a vertical direction with respect to the orientation of FIG. 2) may be substantially equal to a second width W2 of the diffraction grating pattern 224 in a first direction (i.e., a horizontal direction with respect to the orientation of FIG. 2) intersecting with the second direction. In FIG. 2, the first width W1 corresponds to a distance between two neighboring light blocking patterns 222 arranged in the second direction, and the second width W2 corresponds to a distance between two neighboring light blocking patterns 222 arranged in the first direction.

As fully illustrated in a circular region of FIG. 2, the light blocking patterns 222 may be arrayed to have a first pitch 'd1' in the first direction, a second pitch 'd2' in the second direction, and a third pitch 'd3' in a diagonal direction. The first pitch 'd1' may be substantially equal to the second pitch 'd2.' The third pitch 'd3' may be greater than the first pitch 'd1' and the second pitch 'd2.' Optical transmittance of the light blocking area 220 surrounding the pre-alignment pattern 210 may be determined according to the pitches of the light blocking patterns 222. Specifically, a diffraction angle 'θ' of a light penetrating the light blocking area 220 may be determined by the following equation 1.

$$\sin \theta = \lambda/d \qquad \text{(Equation 1)}$$

where, 'λ' denotes a wavelength of a light irradiated onto the light blocking area 220 and 'd' denotes a pitch of the light blocking patterns 222. As can be seen from the equation 1, if the pitch 'd' of the light blocking patterns 222 is equal to the wavelength 'λ' of the light irradiated onto the light blocking area 220, the diffraction angle 'θ' of the light penetrating the light blocking area 220 may be 90 degrees. In such a case, intensity of the light penetrating the light blocking area 220 may be minimized. Thus, if the maximum pitch (i.e., the third pith 'd3') among the first to third pitches 'd1', 'd2' and 'd3' of the light blocking patterns 222 is set to be equal to the wavelength 'λ' of the light irradiated onto the light blocking area 220, the intensity of the light penetrating the light blocking area 220 may be minimized.

In some embodiments, if the pre-alignment key 200 is designed so that the diffraction angle 'θ' of the light penetrating the light blocking area 220 is equal to or greater than 42 degrees, the intensity of the light penetrating the light blocking area 220 may be smaller than that of a case that the pre-alignment key 200 is designed so that the entire surface of the light blocking area 220 is covered with a light blocking layer.

In order that the diffraction angle 'θ' of the light penetrating the light blocking area 220 is equal to or greater than 42 degrees, the maximum pitch (i.e., the third pith 'd3') among the first to third pitches 'd1,' 'd2' and 'd3' of the light blocking patterns 222 has to be equal to or less than 1.5 times the wavelength 'λ' of the light irradiated onto the light blocking area 220. As a result, if the maximum pitch (i.e., the third pith 'd3') of the light blocking patterns 222 is set to be equal to or less than 1.5 times the wavelength 'λ' of the light irradiated onto the light blocking area 220, the diffraction angle 'θ' of the light penetrating the light blocking area 220 may be within a range of about 42 degrees to about 90 degrees.

Figure 4:
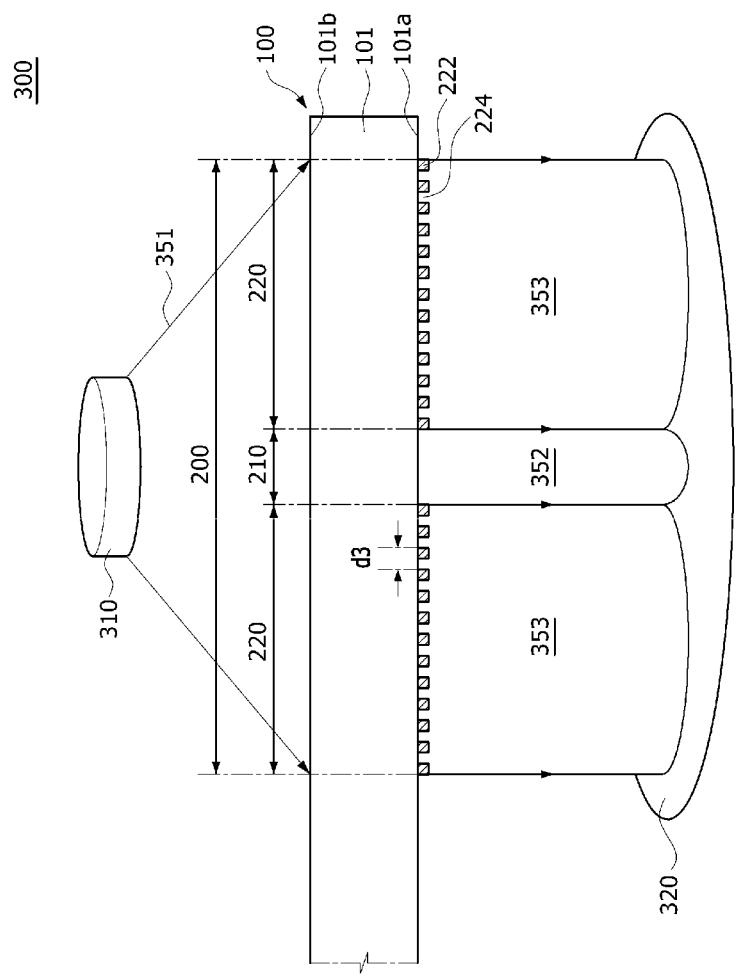
FIG. 4 is a schematic view illustrating a portion of a photolithography apparatus to describe a pre-alignment process performed using the photo mask of FIG. 1.

FIG. 4 is a schematic view illustrating a portion of a photolithography apparatus 300 to describe a pre-alignment process performed using the photo mask 100 of FIG. 1. Referring to FIG. 4, the photolithography apparatus 300 may include an alignment light source 310 and an optical receiver 320.

The photo mask 100 may be disposed at a stage (not shown) between the alignment light source 310 and the optical receiver 320. The photo mask 100 may include at least one pre-alignment key 200 disposed on the top surface 101a of the light transmission substrate 101, as described above with reference to FIGS. 1, 2 and 3.

The pre-alignment key 200 may include the pre-alignment pattern 210 corresponding to a light transmitting area and the light blocking area 220 surrounding the pre-alignment pattern 210. The light blocking area 220 may include the plurality of light blocking patterns 222 and the diffraction grating pattern 224 separating the plurality of light blocking patterns 222 from each other.

The photo mask 100 may be disposed in the photolithography apparatus 300 so that the top surface 101a of the light transmission substrate 101 faces the optical receiver 320 and the bottom surface 101b of the light transmission substrate 101 faces the alignment light source 310.

The alignment light source 310 may be used in a pre-alignment process for accurately loading the photo mask 100 at a predetermined position in the photolithography apparatus 300 using the pre-alignment key 200. The alignment light source 310 may be distinguished from a light source used in an exposure step of a photolithography process. The light source used in the exposure step of the photolithography process may be a light source generating a g-line beam having a wavelength of about 436 nanometers, a light source generating an i-line beam having a wavelength of about 364 nanometers, a light source generating a krypton fluoride (KrF) laser beam having a wavelength of about 248 nanometers, or a light source generating an argon fluoride (ArF) laser beam having a wavelength of about 193 nanometers.

In some embodiments, the alignment light source 310 used in the pre-alignment process may include a light emitting diode (LED) generating a light having a wavelength of about 780 nanometers to about 980 nanometers. If the light generated from the LED is irradiated on a chrome (Cr) layer acting as a light blocking layer, the chrome (Cr) layer may exhibit optical transmittance of about 40%.

In the embodiment using the LED generating the light having the wavelength of about 780 nanometers to about 980 nanometers, the maximum pitch of the plurality of light blocking patterns 222 may be within a range of about 1170 nanometers to about 1470 nanometers in order that the diffraction angle 'θ' of the light penetrating the light blocking area 220 is equal to or greater than 42 degrees.

If the light generated from the alignment light source 310 is irradiated onto the photo mask 100, the optical receiver 320 may detect a light passing through the pre-alignment key 200, particularly, the pre-alignment pattern 210, to obtain a coordinate of the photo mask 100 located in the photolithography apparatus 300. The photolithography apparatus 300 may adjust the location of the photo mask 100 using the coordinate of the photo mask 100.

In order that the optical receiver 320 accurately detects the light passing through the pre-alignment pattern 210, the intensity of a light passing through the light blocking area 220 surrounding the pre-alignment pattern 210 has to be smaller than a certain value. For example, if the intensity of a light 352 passing through the pre-alignment pattern 210 is about 100 percent of the intensity of a light 351 generated from the alignment light source 310 and the intensity of a light 353 passing through the light blocking area 220 is about 40 percent of the intensity of the light 351 generated from the alignment light source 310, a resolution at an interface between the light 352 passing through the pre-alignment pattern 210 and the light 353 passing through the light blocking area 220 may be degraded, thereby causing an error in obtaining the coordinate of the photo mask 100 located in the photolithography apparatus 300. This pre-alignment error may occur when the intensity of the light 353 passing through the light blocking area 220 is equal to or greater than about 40 percent of the intensity of the light 351 generated from the alignment light source 310. Therefore, in an embodiment, the certain value may be 40 percent of the intensity of the light 351 generated from the alignment light source 310.

The light blocking patterns 222 and the diffraction grating pattern 224 in the light blocking area 220 may be designed so that the maximum pitch (i.e., the third pitch 'd3') of the light blocking patterns 222 is equal to or less than 1.5 times a wavelength 'λ' of the light 351 irradiated onto the light blocking area 220. If the third pitch 'd3' is approximately 1.5 times the wavelength 'λ' of the light 351 irradiated onto the light blocking area 220, a diffraction angle 'θ' of the light 353 passing through the light blocking area 220 may be approximately 42 degrees. If the third pitch 'd3' is equal to the wavelength 'λ' of the light 351 irradiated onto the light blocking area 220, the diffraction angle 'θ' of the light 353 passing through the light blocking area 220 may be approximately 90 degrees. Even if the third pitch 'd3' is smaller than the wavelength 'λ' of the light 351 irradiated onto the light blocking area 220, the diffraction angle 'θ' of the light 353 passing through the light blocking area 220 may be approximately 90 degrees. Thus, if the third pitch 'd3' is equal to or smaller than 1.5 times the wavelength 'λ' of the light 351 irradiated onto the light blocking area 220, the diffraction angle 'θ' of the light 353 passing through the light blocking area 220 may be within the range of about 42 degrees to about 90 degrees.

If the light blocking patterns 222 and the diffraction grating pattern 224 are designed so that the light 353 passing through the light blocking area 220 is diffracted at an angle in the range of about 42 degrees to about 90 degrees, a light passing through the light blocking patterns 222 and a light passing through the diffraction grating pattern 224 may be offset each other. As a result, less light may be detected by the optical receiver 320 in a region corresponding to the light blocking area 220. The offset efficiency of the light passing through the light blocking patterns 222 and the light passing through the diffraction grating pattern 224 may increase as the diffraction angle 'θ' of the light passing through the light blocking area 220 becomes close to 90 degrees.

Accordingly, if the light blocking area 220 is designed so that the diffraction angle 'θ' is within a specific range, the intensity of the light 353 passing through the light blocking area 220 may be controlled to be smaller than approximately 40 percent of the intensity of the light 351 irradiated onto the light blocking area 220. In such a case, the intensity of the light 353 passing through the light blocking area 220 when the light blocking area 220 includes the light blocking patterns 222 and the diffraction grating pattern 224 may be smaller than the intensity of a light passing through the light blocking area 220 when the entire surface of the light blocking area 220 is covered with a light blocking layer. Thus, a resolution of the light 352 passing through the pre-alignment pattern 210 may be improved, thereby preventing an error from occurring when detecting the light 352 passing through the pre-alignment pattern 210.

Figure 5:
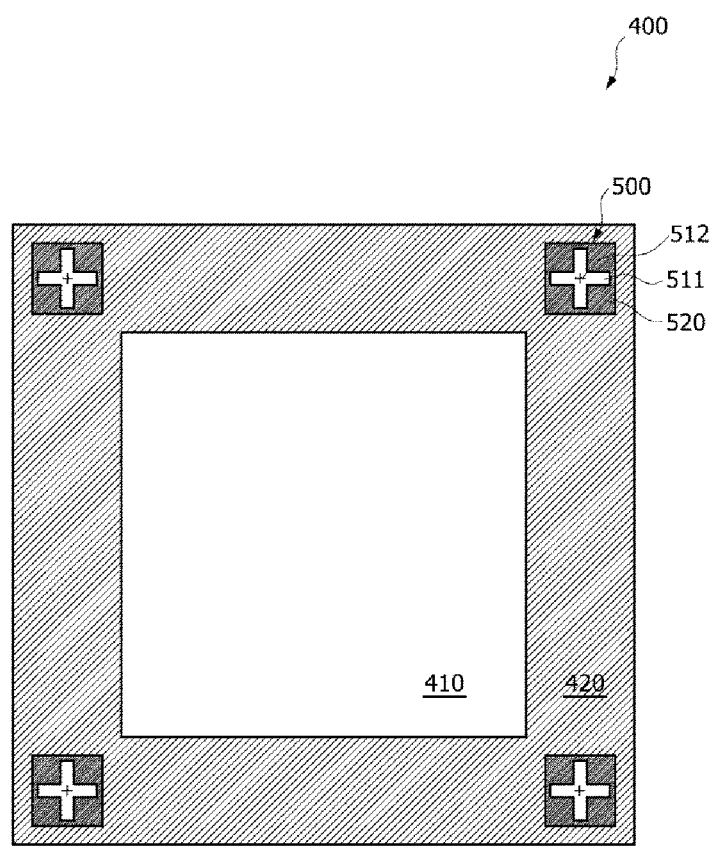
FIG. 5 is a plan view illustrating a photo mask according to a second embodiment.

FIG. 5 is a plan view illustrating a photo mask 400 according to a second embodiment. Referring to FIG. 5, the photo mask 400 may include a pattern region 410 and a frame region 420. The frame region 420 may be disposed to surround the pattern region 410. The pattern region 410 may include transfer patterns (not shown) which are to be transferred onto a wafer in a lithography process. The transfer patterns may be dark tone patterns or bright tone patterns.

The frame region 420 may include a light blocking pattern. The frame region 420 may correspond to a marginal region which is provided to prevent process errors from being generated by an unnecessary exposure in a border region between adjacent shot areas (or adjacent chip areas) defined by an exposure step.

At least one pre-alignment key 500 may be disposed in the frame region 420. FIG. 5 illustrates four pre-alignment keys 500 that are respectively disposed in four corners of the frame region 420, but embodiments are not limited thereto. In other embodiments, the number of pre-alignment keys and positions of the pre-alignment keys may be different from those of the embodiment illustrated in FIG. 5.

Each of the pre-alignment keys 500 may include a first pre-alignment pattern 511, a second pre-alignment pattern 512 disposed in the first pre-alignment pattern 511, and a light blocking area 520 surrounding the first pre-alignment pattern 511. In some embodiments, the first pre-alignment pattern 511 may correspond to a light transmitting area, and the second pre-alignment pattern 512 may correspond to a light blocking area. Each of the pre-alignment keys 500 may improve an accuracy of a pre-alignment process by using the first and second pre-alignment patterns 511 and 512. A detailed configuration of each pre-alignment key 500 will be described hereinafter with reference to FIGS. 6 and 7.

Figure 6:
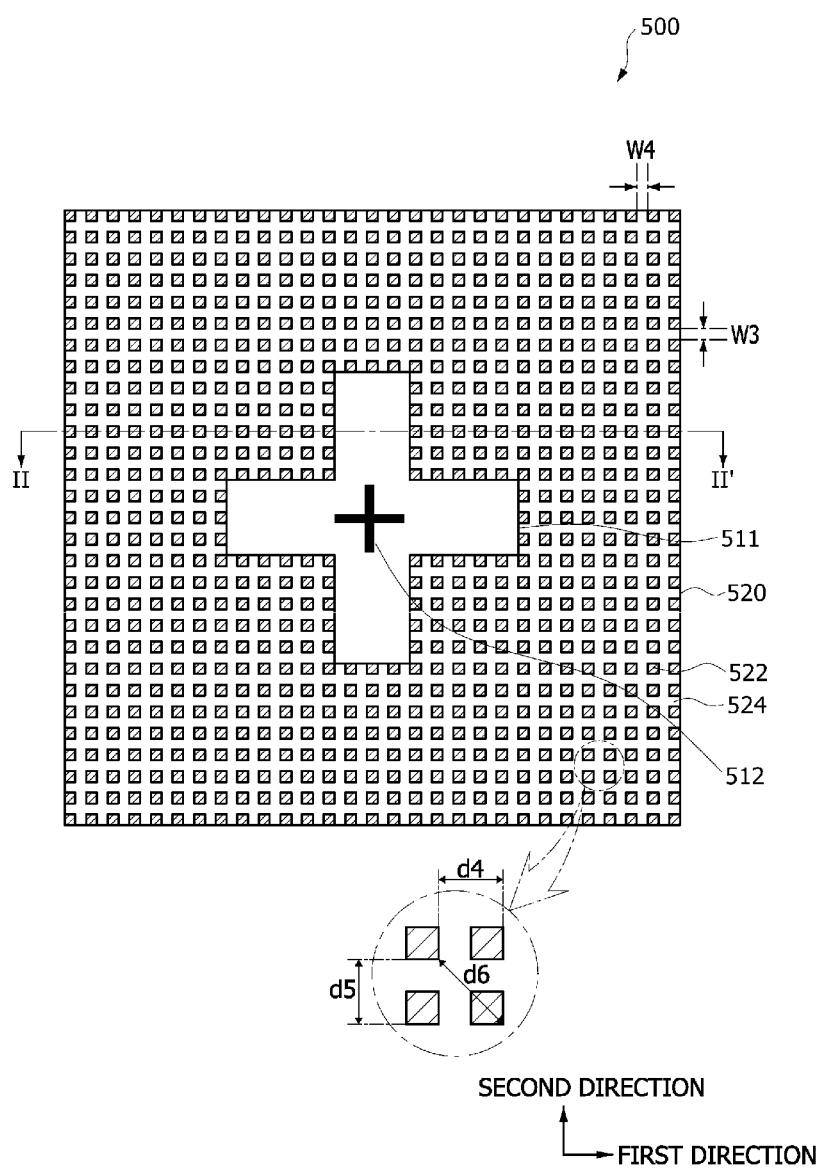
FIG. 6 is an enlarged view of a pre-alignment key included in the photo mask of FIG. 5.
Figure 7:
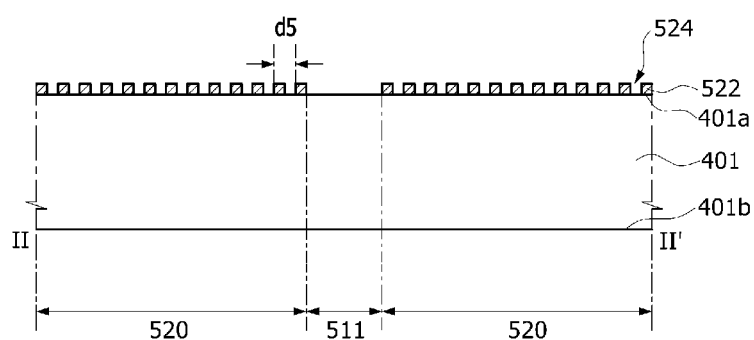
FIG. 7 is a cross-sectional view taken along a line II-II' of FIG. 6.

FIG. 6 is an enlarged view of the pre-alignment key 500 included in the photo mask 400 of FIG. 5, and FIG. 7 is a cross-sectional view taken along a line II-II' of FIG. 6. Referring to FIGS. 6 and 7, the pre-alignment key 500 may include the first pre-alignment pattern 511 having a cross shape when viewed in a plan view, the light blocking area 520 surrounding the first pre-alignment pattern 511, and the second pre-alignment pattern 512 disposed inside the first pre-alignment pattern 511, as described above with reference to FIG. 5.

The pre-alignment key 500 may further improve an accuracy of a pre-alignment process by using a resolution difference between a light passing through the first pre-alignment pattern 511 and a light passing through the second pre-alignment pattern 512 as well as a resolution difference between the light passing through the first pre-alignment pattern 511 and a light passing through the light blocking area 520.

The first pre-alignment pattern 511 may correspond to a light transmitting area in which a top surface 401a of a light transmission substrate 401 is exposed. Thus, if a light is irradiated onto a bottom surface 401b of the light transmission substrate 401, the light may pass through the light transmission substrate 401 and the first pre-alignment pattern 511. In the event that optical loss in the light transmission substrate 401 is negligible, most of the light irradiated toward the first pre-alignment pattern 511 may pass through the first pre-alignment pattern 511.

FIG. 6 illustrates the first pre-alignment pattern 511 having the cross shape, but embodiments are not limited thereto. That is, a planar shape of the first pre-alignment pattern 511 may be different from that of the embodiment illustrated in FIG. 5 according to embodiments.

The light blocking area 520 may include a plurality of first light blocking patterns 522 and a first diffraction grating pattern 524 separating the plurality of first light blocking patterns 522 from each other. The first light blocking patterns 522 may be two-dimensionally disposed on the top surface 401a of the light transmission substrate 401 and each of the first light blocking patterns 522 may have an island shape. Thus, the first diffraction grating pattern 524 disposed between the first light blocking patterns 522 may have a mesh shape when viewed in a plan view. Each of the first light blocking patterns 522 may have a tetragonal shape when viewed in a plan view.

The first diffraction grating pattern 524 may correspond to a light transmitting area in which the top surface 401a of the light transmission substrate 401 is exposed. A first width W3 of the first diffraction grating pattern 524 in a second direction (i.e., a vertical direction with respect to the orientation of FIG. 6) may be substantially equal to a second width W4 of the first diffraction grating pattern 524 in a first direction (i.e., a horizontal direction with respect to the orientation of FIG. 6) intersecting with the second direction. In FIG. 6, the first width W3 corresponds to a distance between two neighboring light blocking patterns 522 arranged in the second direction, and the second width W4 corresponds to a distance between two neighboring light blocking patterns 522 arranged in the first direction.

As fully illustrated in a circular region of FIG. 6, the first light blocking patterns 522 may be arrayed to have a first pitch 'd4' in the first direction, a second pitch 'd5' in the second direction, and a third pitch 'd6' in a diagonal direction. The first pitch 'd4' may be substantially equal to the second pitch 'd5.' The third pitch 'd6' may be greater than the first pitch 'd4' and the second pitch 'd5.'

Optical transmittance of the light blocking area 520 surrounding the first pre-alignment pattern 511 may be determined according to the pitches of the first light blocking patterns 522. As described above with reference to the equation 1, if the maximum pitch (i.e., the third pith 'd6') among the first to third pitches 'd4,' 'd5' and 'd6' of the first light blocking patterns 522 is set to be equal to a wavelength 'λ' of a light irradiated onto the light blocking area 520, the intensity of a light penetrating the light blocking area 520 may be minimized.

In some embodiments, if the pre-alignment key 500 is designed so that the diffraction angle 'θ' of the light penetrating the light blocking area 520 is equal to or greater than 42 degrees, the intensity of the light penetrating the light blocking area 520 may be smaller than that of a case that the pre-alignment key 500 is designed so that the entire surface of the light blocking area 520 is covered with a light blocking layer.

Figure 8:
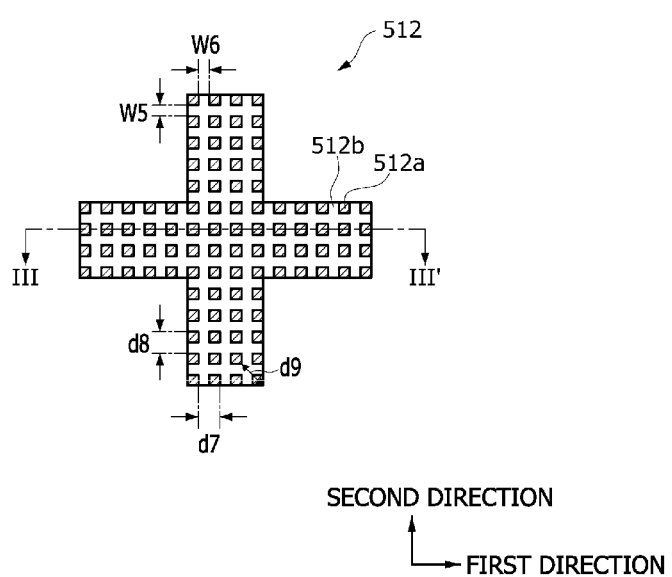
FIG. 8 is an enlarged view of a second pre-alignment pattern included in the pre-alignment key of FIG. 6.
Figure 9:
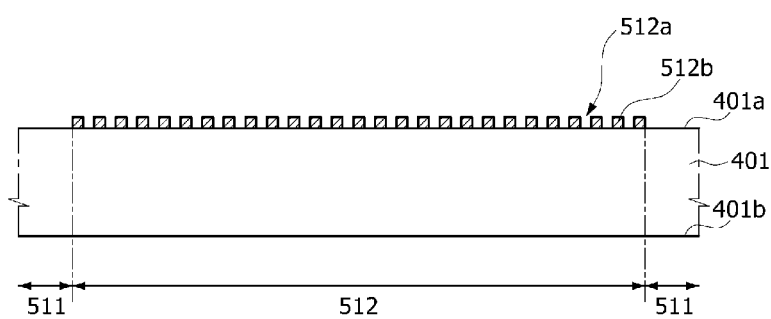
FIG. 9 is a cross-sectional view taken along a line III-III' of FIG. 8.

In order that the diffraction angle 'θ' of the light penetrating the light blocking area 520 is equal to or greater than 42 degrees, the maximum pitch (i.e., the third pith 'd6') among the first to third pitches 'd4,' 'd5' and 'd6' of the first light blocking patterns 522 has to be equal to or smaller than 1.5 times the wavelength 'λ' of the light irradiated onto the light blocking area 520. As a result, if the maximum pitch (i.e., the third pith 'd6') of the first light blocking patterns 522 is equal to or smaller than 1.5 times the wavelength 'λ' of the light irradiated onto the light blocking area 520, the diffraction angle 'θ' of the light penetrating the light blocking area 520 may be within a range of about 42 degrees to about 90 degrees. FIG. 8 is an enlarged view of the second pre-alignment pattern 512 included in the pre-alignment key 500 of FIG. 6, and FIG. 9 is a cross-sectional view taken along a line III-III' of FIG. 8. Referring to FIGS. 8 and 9, the second pre-alignment pattern 512 may have a similar configuration to the light blocking area 520.

That is, the second pre-alignment pattern 512 may include a plurality of second light blocking patterns 512a and a second diffraction grating pattern 512b separating the plurality of second light blocking patterns 512a from each other. The second light blocking patterns 512a may be two-dimensionally disposed on the top surface 401a of the light transmission substrate 401 and each of the second light blocking patterns 512a may have an island shape. Thus, the second diffraction grating pattern 512b disposed between the second light blocking patterns 512a may have a mesh shape when viewed in a plan view. Each of the second light blocking patterns 512a may have a tetragonal shape when viewed in a plan view.

The second diffraction grating pattern 512b may correspond to a light transmitting area in which the top surface 401a of the light transmission substrate 401 is exposed. A first width W5 of the second diffraction grating pattern 512b in a second direction (i.e., a vertical direction with respect to the orientation of FIG. 8) may be substantially equal to a second width W6 of the second diffraction grating pattern 512b in a first direction (i.e., a horizontal direction with respect to the orientation of FIG. 8) intersecting with the second direction. In FIG. 8, the first width W5 corresponds to a distance between two neighboring second light blocking patterns 512a arranged in the second direction, and the second width W6 corresponds to a distance between two neighboring second light blocking patterns 512a arranged in the first direction.

The second light blocking patterns 512a may be arrayed to have a first pitch 'd7' in the first direction, a second pitch 'd8' in the second direction, and a third pitch 'd9' in a diagonal direction. The first pitch 'd7' may be substantially equal to the second pitch 'd8.' The third pitch 'd9' may be greater than the first pitch 'd7' and the second pitch 'd8.' Optical transmittance of the second pre-alignment pattern 512 may be determined according to the pitches of the second light blocking patterns 512a. As described above with reference to the equation 1, if the maximum pitch (i.e., the third pith 'd9') among the first to third pitches 'd7,' 'd8' and 'd9' of the second light blocking patterns 512a is equal to a wavelength 'λ' of a light irradiated onto the second pre-alignment pattern 512, the intensity of the light penetrating the second pre-alignment pattern 512 may be minimized.

In some embodiments, if the pre-alignment key 500 is designed so that a diffraction angle 'θ' of the light penetrating the second pre-alignment pattern 512 is equal to or greater than 42 degrees, the intensity of the light penetrating the second pre-alignment pattern 512 may be smaller than that of a case that the pre-alignment key 500 is designed so that the entire surface of the second pre-alignment pattern 512 is covered with a light blocking layer.

In order that the diffraction angle 'θ' of the light penetrating the second pre-alignment pattern 512 is equal to or greater than 42 degrees, the maximum pitch (i.e., the third pith 'd9') among the first to third pitches 'd7,' 'd8' and 'd9' of the second light blocking patterns 512a has to be equal to or smaller than 1.5 times the wavelength 'λ' of the light irradiated onto the second pre-alignment pattern 512. As a result, if the maximum pitch (i.e., the third pith 'd9') of the second light blocking patterns 512a is set to be equal to or smaller than 1.5 times the wavelength 'λ' of the light irradiated onto the second pre-alignment pattern 512, the diffraction angle 'θ' of the light penetrating the second pre-alignment pattern 512 may be within a range of about 42 degrees to about 90 degrees.

Figure 10:
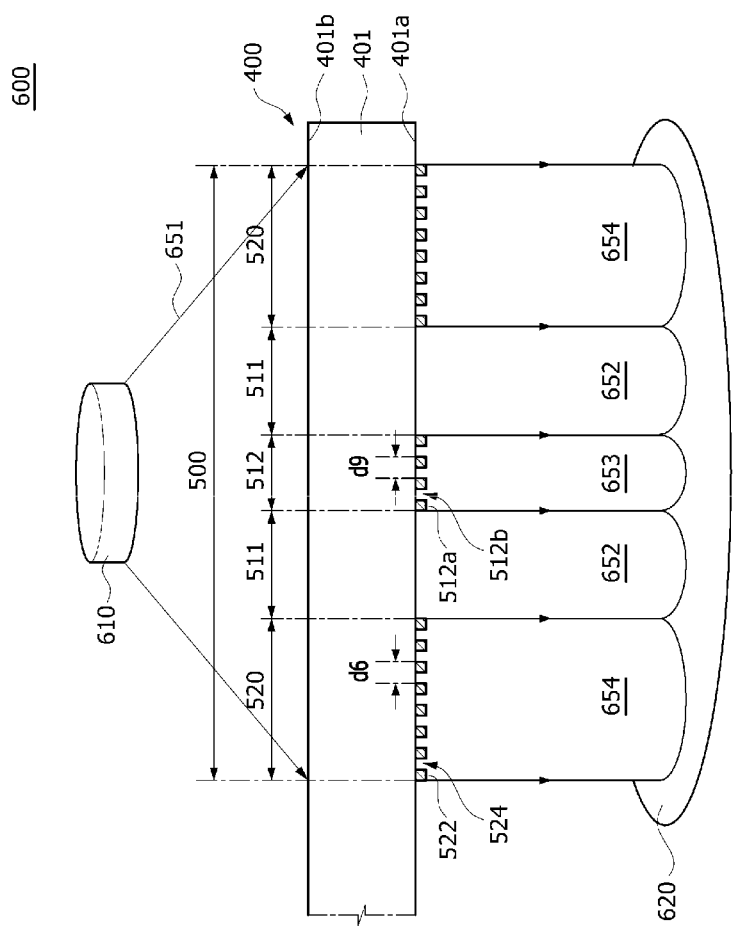
FIG. 10 is a schematic view illustrating a portion of a photolithography apparatus to describe a pre-alignment process performed using the photo mask of FIG. 5.

FIG. 10 is a schematic view illustrating a portion of a photolithography apparatus 600 to describe a pre-alignment process performed using the photo mask 400 of FIG. 5. Referring to FIG. 10, the photolithography apparatus 600 may include an alignment light source 610 and an optical receiver 620.

The photo mask 400 may be disposed at a stage (not shown) between the alignment light source 610 and the optical receiver 620. The photo mask 400 may include at least one pre-alignment key 500 disposed on the top surface 401a of the light transmission substrate 401, as described above with reference to FIGS. 5 to 9.

The pre-alignment key 500 may include the first pre-alignment pattern 511 corresponding to a light transmitting area, the light blocking area 520 surrounding the first pre-alignment pattern 511, and the second pre-alignment pattern 512 disposed in the first pre-alignment pattern 511.

The light blocking area 520 may include the plurality of first light blocking patterns 522 and the first diffraction grating pattern 524 separating the plurality of first light blocking patterns 522 from each other. The second pre-alignment pattern 512 may include the plurality of second light blocking patterns 512*a* and the second diffraction grating pattern 512*b* separating the plurality of second light blocking patterns 512*a* from each other.

The photo mask 400 may be disposed in the photolithography apparatus 600 so that the top surface 401*a* of the light transmission substrate 401 faces the optical receiver 620 and the bottom surface 401*b* of the light transmission substrate 401 faces the alignment light source 610.

The alignment light source 610 may be used in a pre-alignment process for accurately loading the photo mask 400 at a predetermined position in the photolithography apparatus 600 using the pre-alignment key 500. The alignment light source 610 may be distinguished from a light source used in an exposure step of a photolithography process. The alignment light source 610 may have the same characteristic as that of the alignment light source 310 described above with reference to FIG. 4. That is, the alignment light source 610 may include a light emitting diode (LED) generating a light having a wavelength of about 780 nanometers to about 980 nanometers.

If the light generated from the alignment light source 610 is irradiated onto the photo mask 400, the optical receiver 620 may detect a light passing through the pre-alignment key 500, particularly, the first pre-alignment pattern 511, to obtain a coordinate of the photo mask 400 located in the photolithography apparatus 600. The photolithography apparatus 600 may adjust the location of the photo mask 400 using the coordinate of the photo mask 400.

In order that the optical receiver 620 accurately detects a light 652 passing through the first pre-alignment pattern 511, the intensity of a light 654 passing through the light blocking area 520 surrounding the first pre-alignment pattern 511 and the intensity of a light 653 passing through the second pre-alignment pattern 512 have to be smaller than a certain value. For example, if the intensity of the light 652 passing through the first pre-alignment pattern 511 is about 100 percent of the intensity of a light 651 generated from the alignment light source 610 and if the intensity of the light 653 passing through the second pre-alignment pattern 512 and the light 654 passing through the light blocking area 520 each are about 40 percent of the intensity of the light 651 generated from the alignment light source 610, a first resolution at an interface between the light 652 passing through the first pre-alignment pattern 511 and the light 653 passing through the second pre-alignment pattern 512 as well as a second resolution at an interface between the light 652 passing through the first pre-alignment pattern 511 and the light 654 passing through the light blocking area 520 may be degraded, thereby causing an error in obtaining the coordinate of the photo mask 400 located in the photolithography apparatus 600. This pre-alignment error may occur when the intensity of the light 654 passing through the light blocking area 520 and the light 653 passing through the second pre-alignment pattern 512 each are equal to or greater than about 40 percent of the intensity of the light 651 generated from the alignment light source 610. Therefore, in an embodiment, the certain value may be 40 percent of the intensity of the light 651 generated from the alignment light source 610.

The first light blocking patterns 522 and the first diffraction grating pattern 524 in the light blocking area 520 may be designed so that the maximum pitch (i.e., the third pitch 'd6') of the first light blocking patterns 522 is equal to or smaller than 1.5 times a wavelength '$\lambda$' of the light 651 irradiated onto the light blocking area 520. If the third pitch 'd6' is approximately 1.5 times the wavelength '$\lambda$' of the light 651 irradiated onto the light blocking area 520, a diffraction angle '$\theta$' of the light 654 passing through the light blocking area 520 may be approximately 42 degrees. If the third pitch 'd6' is equal to the wavelength '$\lambda$' of the light 651 irradiated onto the light blocking area 520, the diffraction angle '$\theta$' of the light 654 passing through the light blocking area 520 may be approximately 90 degrees. Even if the third pitch 'd6' is smaller than the wavelength '$\lambda$' of the light 651 irradiated onto the light blocking area 520, the diffraction angle '$\theta$' of the light 654 passing through the light blocking area 520 may be approximately 90 degrees. Thus, if the third pitch 'd6' is equal to or smaller than 1.5 times the wavelength '$\lambda$' of the light 651 irradiated onto the light blocking area 520, the diffraction angle '$\theta$' of the light 654 passing through the light blocking area 520 may be within the range of about 42 degrees to about 90 degrees.

If the first light blocking patterns 522 and the first diffraction grating pattern 524 are designed so that the light 654 passing through the light blocking area 520 is diffracted at an angle in the range of about 42 degrees to about 90 degrees, a light passing through the first light blocking patterns 522 and a light passing through the first diffraction grating pattern 524 may be offset each other. As a result, less light may be detected by the optical receiver 620 in a region corresponding to the light blocking area 520. The offset efficiency of the light passing through the first light blocking patterns 522 and the light passing through the first diffraction grating pattern 524 may increase as the diffraction angle '$\theta$' of the light 654 passing through the light blocking area 520 becomes close to 90 degrees.

Accordingly, if the light blocking area 520 is designed so that the diffraction angle '$\theta$' is within a specific range, the intensity of the light 654 passing through the light blocking area 520 may be controlled to be smaller than approximately 40 percent of the intensity of the light 651 irradiated onto the light blocking area 520. In such a case, the intensity of the light 654 passing through the light blocking area 520 when the light blocking area 520 includes the first light blocking patterns 522 and the first diffraction grating pattern 524 may be smaller than the intensity of a light passing through the light blocking area 520 when the entire surface of the light blocking area 520 is covered with a light blocking layer. Thus, a resolution at an interface between the light 652 passing through the first pre-alignment pattern 511 and the light 654 passing through the light blocking area 520 may be improved, thereby preventing an error from occurring when detecting the light 652 passing through the first pre-alignment pattern 511.

Similarly, the second light blocking patterns 512*a* and the second diffraction grating pattern 512*b* in the second pre-alignment pattern 512 may be designed so that the maximum pitch (i.e., the third pitch 'd9') of the second light blocking patterns 512*a* is equal to or smaller than 1.5 times the wavelength '$\lambda$' of the light 651 irradiated onto the second pre-alignment pattern 512. If the third pitch 'd9' is approximately 1.5 times the wavelength '$\lambda$' of the light 651 irradiated onto the second pre-alignment pattern 512, the diffraction angle '$\theta$' of the light 653 passing through the second pre-alignment pattern 512 may be approximately 42 degrees.

If the third pitch 'd9' is equal to the wavelength 'λ' of the light 651 irradiated onto the second pre-alignment pattern 512, the diffraction angle 'θ' of the light 653 passing through the second pre-alignment pattern 512 may be approximately 90 degrees. Even if the third pitch "d9" is smaller than the wavelength 'λ' of the light 651 irradiated onto the second pre-alignment pattern 512, the diffraction angle 'θ' of the light 653 passing through the second pre-alignment pattern 512 may be approximately 90 degrees. Thus, if the third pitch 'd9' is equal to or smaller than 1.5 times the wavelength 'λ' of the light 651 irradiated onto the second pre-alignment pattern 512, the diffraction angle 'θ' of the light 653 passing through the second pre-alignment pattern 512 may be within the range of about 42 degrees to about 90 degrees.

If the second light blocking patterns 512a and the second diffraction grating pattern 512b are designed so that the light 653 passing through the second pre-alignment pattern 512 is diffracted at an angle in the range of about 42 degrees to about 90 degrees, a light passing through the second light blocking patterns 512a and a light passing through the second diffraction grating pattern 512b may be offset each other. As a result, less light may be detected by the optical receiver 620 in a region corresponding to the second pre-alignment pattern 512. The offset efficiency of the light passing through the second light blocking patterns 512a and the light passing through the second diffraction grating pattern 512b may increase as the diffraction angle 'θ' of the light 653 passing through the second pre-alignment pattern 512 becomes close to 90 degrees.

Accordingly, if the second pre-alignment pattern 512 is designed so that the diffraction angle 'θ' is within a specific range, the intensity of the light 653 passing through the second pre-alignment pattern 512 may be controlled to be smaller than approximately 40 percent of the intensity of the light 651 irradiated onto the second pre-alignment pattern 512. In such a case, the intensity of the light 653 passing through the second pre-alignment pattern 512 when the second pre-alignment pattern 512 is designed to include the second light blocking patterns 512a and the second diffraction grating pattern 512b may be smaller than the intensity of a light passing through the second pre-alignment pattern 512 when the entire surface of the second pre-alignment pattern 512 is covered with a light blocking layer. Thus, a resolution at an interface between the light 652 passing through the first pre-alignment pattern 511 and the light 653 passing through the second pre-alignment pattern 512 may be improved, thereby preventing an error from occurring when detecting the light 652 passing through the first pre-alignment pattern 511.

Figure 11:
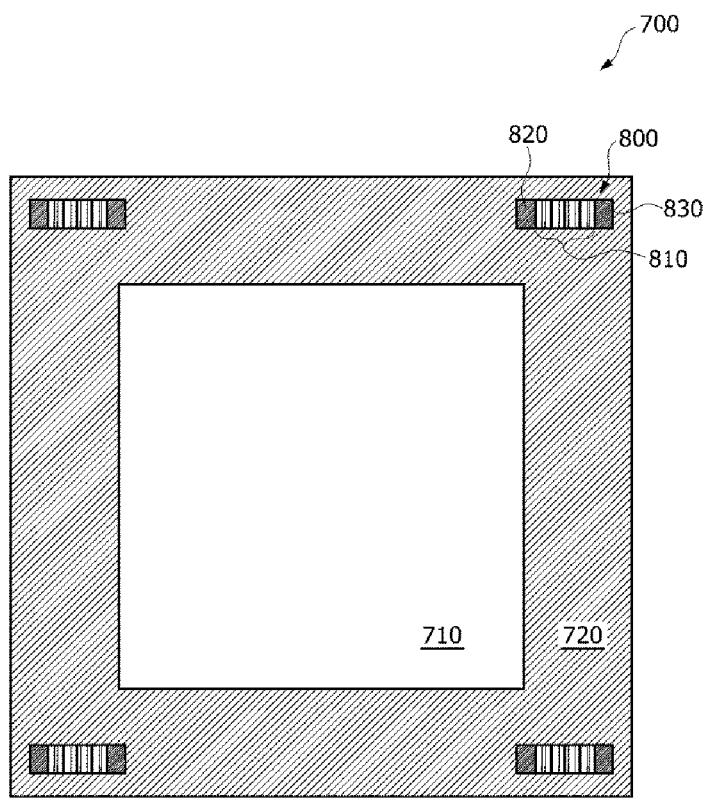
FIG. 11 is a plan view illustrating a photo mask according to a third embodiment.

FIG. 11 is a plan view illustrating a photo mask 700 according to a third embodiment. Referring to FIG. 11, the photo mask 700 may include a pattern region 710 and a frame region 720. The frame region 720 may be disposed to surround the pattern region 710. The pattern region 710 may include transfer patterns (not shown) which are to be transferred onto a wafer in a lithography process. The transfer patterns may be dark tone patterns or bright tone patterns.

The frame region 720 may include a light blocking pattern. The frame region 720 may correspond to a marginal region which is provided to prevent process errors from being generated by an unnecessary exposure in a border region between adjacent shot areas (or adjacent chip areas) defined by an exposure step.

At least one pre-alignment key 800 having a bar-code shape may be disposed in the frame region 720. FIG. 11 illustrates four pre-alignment keys 800 that are respectively disposed in four corners of the frame region 720, but embodiments are not limited thereto. In other embodiments, the number of pre-alignment keys and positions of the pre-alignment keys may be different from those of the embodiment illustrated in FIG. 11.

Each of the pre-alignment keys 800 may include an identification pattern area 810 having patterns for representing identification information, a first light blocking area 820 disposed at a first side of the identification pattern area 810, and a second light blocking area 830 disposed at a second side of the identification pattern area 810 opposite to the first light blocking area 820. In some embodiments, any one of the first and second light blocking areas 810 and 820 may be included in the pre-alignment key 800.

Figure 12:
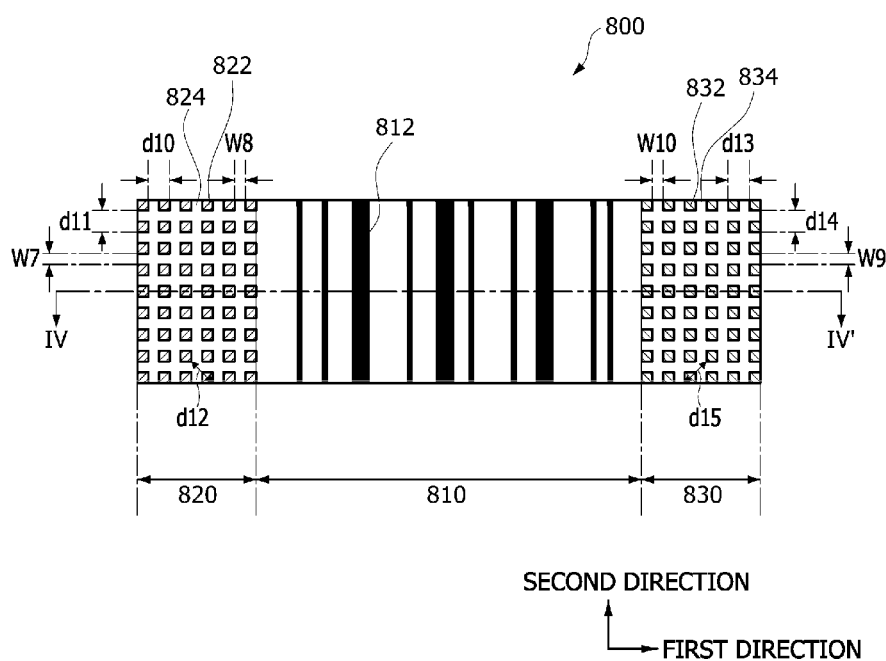
FIG. 12 is an enlarged view of a pre-alignment key included in the photo mask of FIG. 11.
Figure 13:
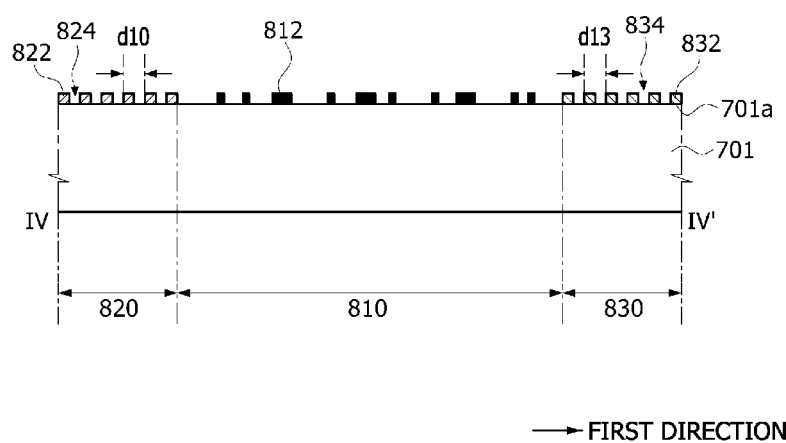
FIG. 13 is a cross-sectional view taken along a line IV-IV' of FIG. 12.

FIG. 12 is an enlarged view of the pre-alignment key 800 included in the photo mask 700 of FIG. 11, and FIG. 13 is a cross-sectional view taken along a line IV-IV' of FIG. 12. Referring to FIGS. 12 and 13, the pre-alignment key 800 may include the identification pattern area 810 having a plurality of identification patterns 812 for representing the identification information, the first light blocking area 820 disposed at the first side of the identification pattern area 810, and the second light blocking area 830 disposed at the second side of the identification pattern area 810 opposite to the first light blocking area 820, as described above with reference to FIG. 11.

In the identification pattern area 810, the identification patterns 812 disposed on a top surface 701a of a light transmission substrate 701 may have different widths, and distances between the identification patterns 812 may also be different. Data corresponding to the identification information of the photo mask 700 may be provided by a combination of the widths of the identification patterns 812 and the distances between the identification patterns 812. Spaces between the identification patterns 812 may expose portions of the top surface 701a of the light transmission substrate 701. In some embodiments, each of the identification patterns 812 may be a light blocking pattern such as a chrome (Cr) pattern.

The first light blocking area 820 may include a plurality of first light blocking patterns 822 and a first diffraction grating pattern 824 separating the plurality of first light blocking patterns 822 from each other. The first light blocking patterns 822 may be two-dimensionally disposed on the top surface 701a of the light transmission substrate 701 and each of the first light blocking patterns 822 may have an island shape. Thus, the first diffraction grating pattern 824 disposed between the first light blocking patterns 822 may have a mesh shape when viewed in a plan view. Each of the first light blocking patterns 822 may have a tetragonal shape when viewed in a plan view.

The first diffraction grating pattern 824 may correspond to a light transmitting area in which the top surface 701a of the light transmission substrate 701 is exposed. A first width W7 of the first diffraction grating pattern 824 in a second direction (i.e., a vertical direction with respect to the orientation of FIG. 12) may be substantially equal to a second width W8 of the first diffraction grating pattern 824 in a first direction (i.e., a horizontal direction with respect to the orientation of FIG. 12) intersecting with the second direction. In FIG. 12, the first width W7 corresponds to a distance between two neighboring first light blocking patterns 822 arranged in the second direction, and the second width W8 corresponds to a distance between two neighboring first light blocking patterns 822 arranged in the first direction.

The first light blocking patterns 822 may be arrayed to have a first pitch 'd10' in the first direction, a second pitch 'd11' in the second direction, and a third pitch 'd12' in a diagonal direction. The first pitch 'd10' may be substantially equal to the second pitch 'd11.' The third pitch 'd12' may be greater than the first pitch 'd10' and the second pitch 'd11.' Optical transmittance of the first light blocking area 820 may be determined according to the pitches of the first light blocking patterns 822. As described above with reference to the equation 1, if the maximum pitch (i.e., the third pith 'd12') among the first to third pitches 'd10,' 'd11' and 'd12' of the first light blocking patterns 822 is set to be equal to a wavelength '$\lambda$' of a light irradiated onto the first light blocking area 820, the intensity of the light penetrating the first light blocking area 820 may be minimized.

In some embodiments, if the pre-alignment key 800 is designed so that a diffraction angle '$\theta$' of the light penetrating the first light blocking area 820 is equal to or greater than 42 degrees, the intensity of the light penetrating the first light blocking area 820 may be smaller than that of a case that the pre-alignment key 800 is designed so that the entire surface of the first light blocking area 820 is covered with a light blocking layer.

In order that the diffraction angle '$\theta$' of the light penetrating the first light blocking area 820 is equal to or greater than 42 degrees, the maximum pitch (i.e., the third pith 'd12') among the first to third pitches 'd10,' 'd11' and 'd12' of the first light blocking patterns 822 has to be equal to or smaller than 1.5 times the wavelength '$\lambda$' of the light irradiated onto the first light blocking area 820. As a result, if the maximum pitch (i.e., the third pith 'd12') of the first light blocking patterns 822 is equal to or smaller than 1.5 times the wavelength '$\lambda$' of the light irradiated onto the first light blocking area 820, the diffraction angle '$\theta$' of the light penetrating the first light blocking area 820 may be within a range of about 42 degrees to about 90 degrees.

The second light blocking area 830 may include a plurality of second light blocking patterns 832 and a second diffraction grating pattern 834 separating the plurality of second light blocking patterns 832 from each other. The second light blocking patterns 832 may be two-dimensionally disposed on the top surface 701a of the light transmission substrate 701 and each of the second light blocking patterns 832 may have an island shape. Thus, the second diffraction grating pattern 834 disposed between the second light blocking patterns 832 may have a mesh shape when viewed in a plan view. Each of the second light blocking patterns 832 may have a tetragonal shape when viewed in a plan view. The second diffraction grating pattern 834 may correspond to a light transmitting area in which the top surface 701a of the light transmission substrate 701 is exposed. A first width W9 of the second diffraction grating pattern 834 in the second direction (i.e., the vertical direction in FIG. 12) may be substantially equal to a second width W10 of the second diffraction grating pattern 834 in the first direction (i.e., the horizontal direction in FIG. 12). In FIG. 12, the first width W9 corresponds to a distance between two neighboring second light blocking patterns 832 arranged in the second direction, and the second width W10 corresponds to a distance between two neighboring second light blocking patterns 832 arranged in the first direction. The first width W9 and the second width W10 of the second diffraction grating pattern 834 may be substantially equal to the first width W7 and the second width W8 of the first diffraction grating pattern 824, respectively.

The second light blocking patterns 832 may be arrayed to have a first pitch 'd13' in the first direction, a second pitch 'd14' in the second direction, and a third pitch 'd15' in a diagonal direction. The first pitch 'd13' may be substantially equal to the second pitch 'd14.' The third pitch 'd15' may be greater than the first pitch 'd13' and the second pitch 'd14.' Optical transmittance of the second light blocking area 830 may be determined according to the pitches of the second light blocking patterns 832. As described above with reference to the equation 1, if the maximum pitch (i.e., the third pith 'd15') among the first to third pitches 'd13,' 'd14' and 'd15' of the second light blocking patterns 832 is set to be equal to a wavelength '$\lambda$' of a light irradiated onto the second light blocking area 830, the intensity of the light penetrating the second light blocking area 830 may be minimized.

In some embodiments, if the pre-alignment key 800 is designed so that a diffraction angle '$\theta$' of the light penetrating the second light blocking area 830 is equal to or greater than 42 degrees, the intensity of the light penetrating the second light blocking area 830 may be smaller than that of a case that the pre-alignment key 800 is designed so that the entire surface of the second light blocking area 830 is covered with a light blocking layer.

In order that the diffraction angle '$\theta$' of the light penetrating the second light blocking area 830 is equal to or greater than 42 degrees, the maximum pitch (i.e., the third pith 'd15') among the first to third pitches 'd13,' 'd14' and 'd15' of the second light blocking patterns 832 has to be equal to or smaller than 1.5 times the wavelength '$\lambda$' of the light irradiated onto the second light blocking area 830. As a result, if the maximum pitch (i.e., the third pith 'd15') of the second light blocking patterns 832 is set to be equal to or smaller than 1.5 times the wavelength '$\lambda$' of the light irradiated onto the second light blocking area 830, the diffraction angle '$\theta$' of the light penetrating the second light blocking area 830 may be within the range of about 42 degrees to about 90 degrees. The first, second and third pitches 'd13,' 'd14' and 'd15' of the second light blocking patterns 832 may be substantially equal to the first, second and third pitches 'd10,' 'd11' and 'd12' of the first light blocking patterns 822, respectively.

Figure 14:
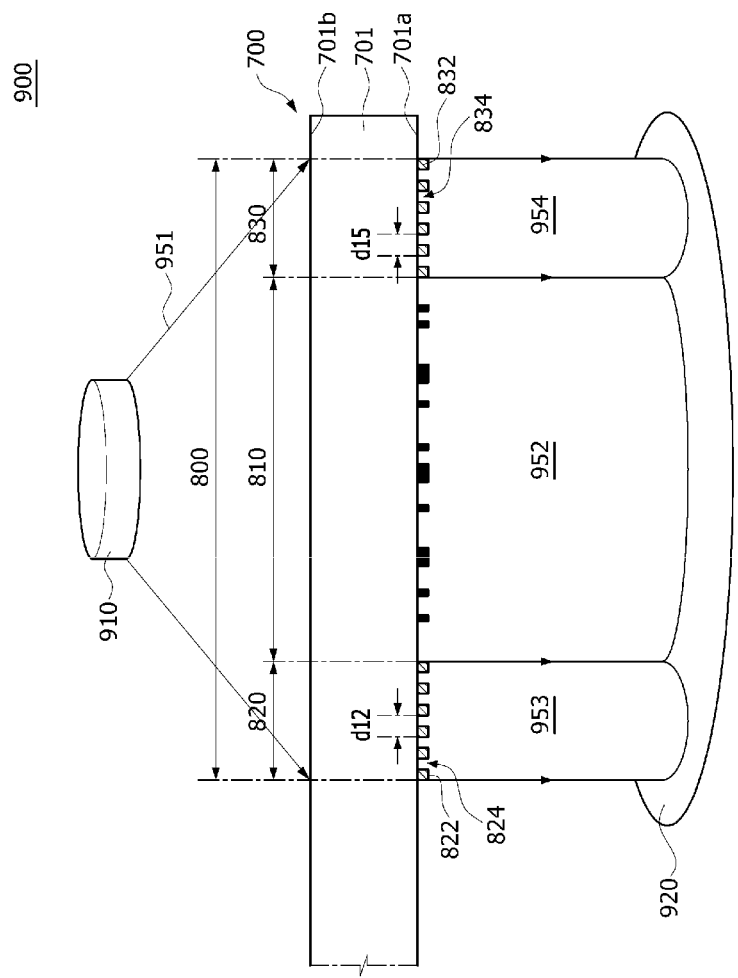
FIG. 14 is a schematic view illustrating a portion of a photolithography apparatus to describe a pre-alignment process performed using the photo mask of FIG. 11.

FIG. 14 is a schematic view illustrating a portion of a photolithography apparatus 900 to describe a pre-alignment process performed using the photo mask 700 of FIG. 11. Referring to FIG. 14, the photolithography apparatus 900 may include an alignment light source 910 and an optical receiver 920.

The photo mask 700 may be disposed at a stage (not shown) between the alignment light source 910 and the optical receiver 920. The photo mask 700 may include at least one barcode-shaped pre-alignment key 800 disposed on the top surface 701a of the light transmission substrate 701, as described above with reference to FIGS. 11 to 13.

As described above, the pre-alignment key 800 may include the identification pattern area 810 having the plurality of identification patterns 812 for representing the identification information, the first light blocking area 820 disposed at the first side of the identification pattern area 810, and the second light blocking area 830 disposed at the second side of the identification pattern area 810 opposite to the first light blocking area 820.

The first light blocking area 820 may include the plurality of first light blocking patterns 822 and the first diffraction grating pattern 824 separating the plurality of first light blocking patterns 822 from each other. The second light blocking area 830 may include the plurality of second light blocking patterns 832 and the second diffraction grating pattern 834 separating the plurality of second light blocking patterns 832 from each other.

The photo mask 700 may be disposed in the photolithography apparatus 900 so that the top surface 701a of the light transmission substrate 701 faces the optical receiver 920 and the bottom surface 701b of the light transmission substrate 701 faces the alignment light source 910.

The alignment light source 910 may be used in a pre-alignment process for accurately loading the photo mask 700 at a predetermined position in the photolithography apparatus 900 using the pre-alignment key 800. The alignment light source 910 may be distinguished from a light source used in an exposure step of a photolithography process. The alignment light source 910 may have the same characteristic as that of the alignment light source 310 or 610 described above with reference to FIG. 4 or FIG. 10. That is, the alignment light source 910 may include a light emitting diode (LED) generating a light having a wavelength of about 780 nanometers to about 980 nanometers.

If the light generated from the alignment light source 910 is irradiated onto the photo mask 700, the optical receiver 920 may detect a light passing through the pre-alignment key 800, particularly, the identification pattern area 810, to obtain a coordinate of the photo mask 700 located in the photolithography apparatus 900. The photolithography apparatus 900 may adjust the location of the photo mask 700 using the coordinate of the photo mask 700.

In order that the optical receiver 920 accurately detects a light 952 passing through the identification pattern area 810, the intensity of a light 953 passing through the first light blocking area 820 and the intensity of a light 954 passing through the second light blocking area 830 have to be smaller than a certain value. For example, if the intensity of the light 953 passing through the first light blocking area 820 and the intensity of the light 954 passing through the second light blocking area 830 each are about 40 percent of the intensity of a light 951 generated from the alignment light source 910, a first resolution at an interface between the light 952 passing through the identification pattern area 810 and the light 953 passing through the first light blocking area 820 as well as a second resolution at an interface between the light 952 passing through the identification pattern area 810 and the light 954 passing through the second light blocking area 830 may be degraded, thereby causing an error in obtaining the coordinate of the photo mask 700 located in the photolithography apparatus 900. This pre-alignment error may occur when the intensity of the light 953 passing through the first light blocking area 820 and the light 954 passing through the second light blocking area 830 each are equal to or greater than about 40 percent of the intensity of the light 951 generated from the alignment light source 910. Therefore, in an embodiment, the certain value may be 40 percent of the intensity of the light 951 generated from the alignment light source 910.

The first light blocking patterns 822 and the first diffraction grating pattern 824 in the first light blocking area 820 may be designed so that the maximum pitch (i.e., the third pitch 'd12') of the first light blocking patterns 822 is equal to or smaller than 1.5 times a wavelength 'λ' of the light 951 irradiated onto the first light blocking area 820. If the third pitch 'd12' is approximately 1.5 times the wavelength 'λ' of the light 951 irradiated onto the first light blocking area 820, a diffraction angle 'θ' of the light 953 passing through the first light blocking area 820 may be approximately 42 degrees. If the third pitch 'd12' is equal to the wavelength 'λ' of the light 951 irradiated onto the first light blocking area 820, the diffraction angle 'θ' of the light 953 passing through the first light blocking area 820 may be approximately 90 degrees. Even if the third pitch 'd12' is smaller than the wavelength 'λ' of the light 951 irradiated onto the first light blocking area 820, the diffraction angle 'θ' of the light 953 passing through the first light blocking area 820 may be approximately 90 degrees. Thus, if the third pitch 'd12' is equal to or smaller than 1.5 times the wavelength 'λ' of the light 951 irradiated onto the first light blocking area 820, the diffraction angle 'θ' of the light 953 passing through the first light blocking area 820 may be within the range of about 42 degrees to about 90 degrees.

If the first light blocking patterns 822 and the first diffraction grating pattern 824 are designed so that the light 953 passing through the first light blocking area 820 is diffracted at an angle in the range of about 42 degrees to about 90 degrees, a light passing through the first light blocking patterns 822 and a light passing through the first diffraction grating pattern 824 may be offset each other. As a result, less light may be detected by the optical receiver 920 in a region corresponding to the first light blocking area 820. The offset efficiency of the light passing through the first light blocking patterns 822 and the light passing through the first diffraction grating pattern 824 may increase as the diffraction angle 'θ' of the light 953 passing through the first light blocking area 820 becomes close to 90 degrees.

Accordingly, if the first light blocking area 820 is designed so that the diffraction angle 'θ' is within a specific range, the intensity of the light 953 passing through the first light blocking area 820 may be controlled to be smaller than approximately 40 percent of the intensity of the light 951 irradiated onto the first light blocking area 820. In such a case, the intensity of the light 953 passing through the first light blocking area 820 when the first light blocking area 820 is designed to include the first light blocking patterns 822 and the first diffraction grating pattern 824 may be smaller than the intensity of a light passing through the first light blocking area 820 when the entire surface of the first light blocking area 820 is covered with a light blocking layer. Thus, a resolution at an interface between the light 952 passing through the identification pattern area 810 and the light 953 passing through the first light blocking area 820 may be improved, thereby preventing an error from occurring when detecting the light 952 passing through the identification pattern area 810.

Similarly, the second light blocking patterns 832 and the second diffraction grating pattern 834 in the second light blocking area 830 may be designed so that the maximum pitch (i.e., the third pitch 'd15') of the second light blocking patterns 832 is equal to or smaller than 1.5 times the wavelength 'λ' of the light 951 irradiated onto the second light blocking area 830. If the third pitch 'd15' is approximately 1.5 times the wavelength 'λ' of the light 951 irradiated onto the second light blocking area 830, the diffraction angle 'θ' of the light 954 passing through the second light blocking area 830 may be approximately 42 degrees. If the third pitch 'd15' is equal to the wavelength 'λ' of the light 951 irradiated onto the second light blocking area 830, the diffraction angle 'θ' of the light 954 passing through the second light blocking area 830 may be approximately 90 degrees. Even if the third pitch 'd15' is smaller than the wavelength 'λ' of the light 951 irradiated onto the second light blocking area 830, the diffraction angle 'θ' of the light 954 passing through the second light blocking area 830 may be approximately 90 degrees. Thus, if the third pitch 'd15' is equal to or smaller than 1.5 times the wavelength 'λ' of the light 951 irradiated onto the second light blocking area 830, the diffraction angle 'θ' of the light 954 passing through the second light blocking area 830 may be within the range of about 42 degrees to about 90 degrees.

If the second light blocking patterns 832 and the second diffraction grating pattern 834 are designed so that the light 954 passing through the second light blocking area 830 is diffracted at an angle in the range of about 42 degrees to about 90 degrees, a light passing through the second light blocking patterns 832 and a light passing through the second diffraction grating pattern 834 may be offset each other. As a result, less light may be detected by the optical receiver 920 in a region corresponding to the second light blocking area 830. The offset efficiency of the light passing through the second light blocking patterns 832 and the light passing through the second diffraction grating pattern 834 may increase as the diffraction angle 'θ' of the light 954 passing through the second light blocking area 830 becomes close to 90 degrees.

Accordingly, if the second light blocking area 830 is designed so that the diffraction angle 'θ' is within a specific range, the intensity of the light 954 passing through the second light blocking area 830 may be controlled to be smaller than approximately 40 percent of the intensity of the light 951 irradiated onto the second light blocking area 830. In such a case, the intensity of the light 954 passing through the second light blocking area 830 when the second light blocking area 830 is designed to include the second light blocking patterns 832 and the second diffraction grating pattern 834 may be smaller than the intensity of a light passing through the second light blocking area 830 when the entire surface of the second light blocking area 830 is covered with a light blocking layer. Thus, a resolution at an interface between the light 952 passing through the identification pattern area 810 and the light 954 passing through the second light blocking area 830 may be improved, thereby preventing an error from occurring when detecting the light 952 passing through the identification pattern area 810.

Although embodiments of the present disclosure have been described for illustrative purposes, those skilled in the art will appreciate that various modifications, additions, and substitutions are possible, without departing from the scope and spirit of the present invention as defined in the accompanying claims.

What is claimed is:

1. A photo mask including a pre-alignment key used in a pre-alignment process performed in a photolithography apparatus, wherein the pre-alignment key comprises:
 a pre-alignment pattern including a light transmitting area; and
 a light blocking area surrounding the pre-alignment pattern,
 wherein the light blocking area includes a plurality of light blocking patterns and a diffraction grating pattern separating the plurality of light blocking patterns from each other.

2. The photo mask of claim 1, further comprising:
 a pattern region in which transfer patterns to be transferred onto a wafer in a lithography process are disposed; and
 a frame region surrounding the pattern region,
 wherein the frame region is covered with a light blocking layer.

3. The photo mask of claim 2, wherein the pre-alignment key is disposed in the frame region.

4. The photo mask of claim 1, wherein the pre-alignment pattern has a cross shape when viewed in a plan view.

5. The photo mask of claim 1, wherein the plurality of light blocking patterns each has an island shape and the diffraction grating pattern has a mesh shape when viewed in a plan view.

6. The photo mask of claim 5, wherein each of the plurality of light blocking patterns has a tetragonal shape when viewed in a plan view.

7. The photo mask of claim 5, wherein the diffraction grating pattern includes a light transmitting area.

8. The photo mask of claim 5, wherein a first width of the diffraction grating pattern in a first direction is substantially equal to a second width of the diffraction grating pattern in a second direction intersecting with the first direction, the first width corresponding to a distance between two adjacent light blocking patterns in the first direction and the second width corresponding to a distance between two adjacent light blocking patterns in the second direction.

9. The photo mask of claim 5, wherein a maximum pitch of the plurality of light blocking patterns is set so that a diffraction angle of a light passing through the light blocking area is within a range of about 42 degrees to about 90 degrees.

10. The photo mask of claim 5, wherein a maximum pitch of the plurality of light blocking patterns is equal to or smaller than 1.5 times a wavelength of a light irradiated onto the light blocking area.

11. The photo mask of claim 5, wherein a maximum pitch of the plurality of light blocking patterns is within a range of about 1170 nanometers to about 1470 nanometers.

12. The photo mask of claim 1, wherein the pre-alignment pattern is a first pre-alignment pattern, and the pre-alignment key further comprises a second pre-alignment pattern disposed in the first pre-alignment pattern.

13. The photo mask of claim 12, wherein each of the first and second pre-alignment patterns has a cross shape when viewed in a plan view.

14. The photo mask of claim 12, wherein the second pre-alignment pattern includes:
 a plurality of second light blocking patterns; and
 a second diffraction grating pattern separating the plurality of second light blocking patterns from each other.

15. The photo mask of claim 14, wherein the plurality of second light blocking patterns each has an island shape and the second diffraction grating pattern has a mesh shape when viewed in a plan view.

16. The photo mask of claim 15, wherein each of the plurality of second light blocking patterns has a tetragonal shape when viewed in a plan view.

17. The photo mask of claim 15, wherein the second diffraction grating pattern includes a light transmitting area.

18. The photo mask of claim 15, wherein a first width of the second diffraction grating pattern in a first direction is substantially equal to a second width of the second diffraction grating pattern in a second direction intersecting with the first direction, the first width corresponding to a distance between two adjacent second light blocking patterns in the first direction and the second width corresponding to a distance between two adjacent second light blocking patterns in the second direction.

19. The photo mask of claim 18,
 wherein the diffraction grating pattern of the light blocking area has a first width in the first direction and a second width in the second direction; and
 wherein the first and second widths of the second diffraction grating pattern are substantially equal to the first and second widths of the diffraction grating pattern of the light blocking area, respectively.

20. The photo mask of claim 15, wherein a maximum pitch of the plurality of second light blocking patterns is set so that a diffraction angle of a light passing through the second pre-alignment pattern is within a range of about 42 degrees to about 90 degrees.

21. The photo mask of claim 15, wherein a maximum pitch of the plurality of second light blocking patterns is within a range of about 1170 nanometers to about 1470 nanometers.

* * * * *